United States Patent
Li

(10) Patent No.: US 11,005,064 B2
(45) Date of Patent: May 11, 2021

(54) TRANSPARENT DISPLAY SUBSTRATE AND DRIVING METHOD THEREOF AND TRANSPARENT DISPLAY DEVICE

(71) Applicants: Hefei Xinsheng Optoelectronics Technology Co., Ltd., Anhui (CN); BOE Technology Group Co., Ltd., Beijing (CN)

(72) Inventor: Meng Li, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/456,669

(22) Filed: Jun. 28, 2019

(65) Prior Publication Data
US 2020/0013986 A1 Jan. 9, 2020

(30) Foreign Application Priority Data
Jul. 9, 2018 (CN) .......................... 201810743769.0

(51) Int. Cl.
*H01L 51/52* (2006.01)
*H01L 51/56* (2006.01)
(Continued)

(52) U.S. Cl.
CPC ....... *H01L 51/5234* (2013.01); *G09G 3/3258* (2013.01); *H01L 27/3258* (2013.01);
(Continued)

(58) Field of Classification Search
CPC ............ H01L 51/5234; H01L 27/3258; H01L 27/3279; H01L 51/5012; H01L 51/56;
(Continued)

(56) References Cited

U.S. PATENT DOCUMENTS

2011/0220901 A1* 9/2011 Ha ................... H01L 51/5092
257/59
2016/0093250 A1* 3/2016 Lee ................... H01L 27/326
345/77

FOREIGN PATENT DOCUMENTS

| CN | 103715230 A | 4/2014 |
| CN | 104465705 A | 3/2015 |

(Continued)

OTHER PUBLICATIONS

Office Action dated May 29, 2020 for application No. CN201810743769.0 with English translation attached.

*Primary Examiner* — Caleen O Sullivan
(74) *Attorney, Agent, or Firm* — Nath, Goldberg & Meyer; Joshua B. Goldberg

(57) ABSTRACT

A transparent display substrate and a driving method thereof, and a transparent display device are provided. The transparent display substrate includes a base substrate and pixel units which are located above the base substrate and arranged in an array, each of the pixel units comprises a display region and a transparent region; a first light emitting layer is provided in the transparent region, and a first electrode is provided at a side of the first light emitting layer proximal to the base substrate and a second electrode is provided at a side of the first light emitting layer distal to the base substrate; a brightness of light emitted by the first light emitting layer is adjusted according to change in a difference between a first voltage and a second voltage loaded on the first electrode and the second electrode, respectively.

17 Claims, 4 Drawing Sheets

(51) Int. Cl.
*H01L 51/50* (2006.01)
*H01L 27/32* (2006.01)
*G09G 3/3258* (2016.01)

(52) U.S. Cl.
CPC ...... *H01L 27/3279* (2013.01); *H01L 51/5012* (2013.01); *H01L 51/56* (2013.01); *G09G 2320/0626* (2013.01); *H01L 2227/323* (2013.01)

(58) Field of Classification Search
CPC .......... H01L 2227/323; H01L 27/3244; G09G 3/3258; G09G 2320/0626; G09G 2300/0408; G09G 2300/0426; G09G 3/3208; G09G 3/32
USPC ........................................................ 257/88
See application file for complete search history.

(56) References Cited

FOREIGN PATENT DOCUMENTS

| | | |
|---|---|---|
| CN | 107221548 A | 9/2017 |
| CN | 107644895 A | 1/2018 |
| CN | 107768545 A | 3/2018 |

\* cited by examiner

TRANSPARENT DISPLAY SUBSTRATE AND DRIVING METHOD THEREOF AND TRANSPARENT DISPLAY DEVICE

CROSS-REFERENCE TO RELATED APPLICATIONS

The present disclosure claims the priority of the Chinese Patent Application No. 2018/10743769.0, filed on Jul. 9, 2018, the contents of which are incorporated herein by reference.

TECHNICAL FIELD

The present disclosure relates to a transparent display substrate and a driving method thereof, and a transparent display device.

BACKGROUND

With the advancement of science and technology, transparent display devices are more and more widely applied. The transparent display device not only can display a desired screen, but also can allow a user to see objects behind the transparent display device through it.

SUMMARY

The present disclosure provides a transparent display substrate, including: a base substrate and pixel units which are located above the base substrate and arranged in an array, each of the pixel units includes a display region and a transparent region; a first light emitting layer is provided in the transparent region, and a first electrode is provided at a side of the first light emitting layer proximal to the base substrate and a second electrode is provided at a side of the first light emitting layer distal to the base substrate; a brightness of light emitted by the first light emitting layer is adjusted according to change in a difference between a first voltage and a second voltage loaded on the first electrode and the second electrode, respectively.

In an embodiment, the first light emitting layer includes an electroluminescent layer.

In an embodiment, the transparent display substrate further includes a voltage line coupled to the first electrode, and an auxiliary electrode, the voltage line and the auxiliary electrode are both located in the display region; and the voltage line is configured to output the first voltage to the first electrode, and the auxiliary electrode is configured to output the second voltage to the second electrode.

In an embodiment, the first electrode extends from the transparent region to the display region, and is electrically coupled to the voltage line in the display region through a fourth via hole in a first insulation layer arranged between the voltage line and the first electrode; and the second electrode extends from the transparent region to the display region, and is electrically coupled to the auxiliary electrode in the display region through a third via hole in a second insulation layer arranged between the voltage line and the first electrode.

In an embodiment, an orthographic projection of the first light emitting layer on the base substrate is entirely covered by an orthographic projection of the transparent region on the base substrate.

In an embodiment, the first electrode and the second electrode are both made of a transparent conducive material.

In an embodiment, a second light emitting layer is provided in the display region, and a third electrode is provided at a side of the second light emitting layer proximal to the base substrate, and the second electrode is provided at a side of the second light emitting layer distal to the base substrate.

In an embodiment, the third electrode is a reflective electrode.

In an embodiment, a drive thin film transistor is provided in the display region, and the drive thin film transistor includes a gate, a source, and a drain, and the gate of the drive thin film transistor is coupled to a gate line, the source of the drive thin film transistor is coupled to a data line, and the drain of the drive thin film transistor is coupled to the third electrode.

In an embodiment, the third electrode is electrically coupled to the drain of the drive thin film transistor by a connection structure formed in a third via hole in a third insulation layer arranged between the third electrode and the drain in the display region.

In an embodiment, the voltage line is disposed at a same layer as the source and the drain.

In an embodiment, the voltage line is disposed at a same layer as the gate.

In an embodiment, the third insulation layer is a part of the first insulation layer extending into the display region; and the transparent display substrate further includes a pixel definition layer provided on the first and third electrodes, which are provided on the first insulation layer, the pixel definition layer is provided with a first opening in the transparent region and a second opening in the display region, and the first light emitting layer and the second light emitting layer are provided in the first opening and the second opening respectively.

In an embodiment, the transparent display substrate further includes a gate driver and a data driver, and the transparent display substrate further includes a control line and a switch transistor provided corresponding to a column of pixel units, a control pole of the switch transistor is coupled to the control line, and the control line is further coupled to the gate driver; and a first pole of the switch transistor is coupled to the data driver; and a second pole of the switch transistor extends through the display region of each pixel unit of the column of pixel units to be coupled to the voltage line in the pixel unit.

The present disclosure further provides a transparent display device, including: the transparent display substrate as described above and an encapsulation structure provided opposite to the transparent display substrate.

The present disclosure further provides a driving method of a transparent display substrate, the transparent display substrate includes a base substrate and pixel units which are located above the base substrate and arranged in an array, each of the pixel units includes a display region and a transparent region, a first light emitting layer is provided in the transparent region, and a first electrode is provided at a side of the first light emitting layer proximal to the base substrate and a second electrode is provided at a side of the first light emitting layer distal to the base substrate; the method includes: loading a first voltage and a second voltage on the first electrode and the second electrode, respectively, to drive the first light emitting layer to emit light; and adjusting a brightness of light emitted by the first light emitting layer, by changing a difference between a first voltage and a second voltage loaded on the first electrode and the second electrode, respectively.

In an embodiment, the transparent display substrate further includes a gate driver and a data driver, and the transparent display substrate further includes a control line and a switch transistor provided corresponding to a column of pixel units, a control pole of the switch transistor is coupled to the control line, and the control line is further coupled to the gate driver; and a first pole of the switch transistor is coupled to the data driver; and a second pole of the switch transistor extends through the display region of each pixel unit of the column of pixel units to be coupled to the voltage line in the pixel unit; before the loading a first voltage and a second voltage on the first electrode and the second electrode, respectively, to drive the first light emitting layer to emit light, the method includes outputting, by the gate driver, a control signal to the control pole of the switch transistor, to turn on the switch transistor; and outputting, by the data driver, the first voltage to the first electrode through the turned-on switch transistor and the voltage line.

In an embodiment, the transparent display device includes a base substrate and pixel units which are located above the base substrate and arranged in an array, each of the pixel units includes a display region and a transparent region, the manufacturing method includes: providing a base substrate; forming a first electrode on the base substrate in the transparent region; forming a first light emitting layer on the first electrode; and forming a second electrode on the first light emitting layer; a brightness of light emitted by the first light emitting layer is adjusted according to change in a difference between a first voltage and a second voltage loaded on the first electrode and the second electrode, respectively.

In an embodiment, the manufacturing method further includes forming a voltage line and an auxiliary electrode on the base substrate in the display region, and the voltage line is configured to output the first voltage to the first electrode, and the auxiliary electrode is configured to output the second voltage to the second electrode.

In an embodiment, the manufacturing method further includes forming a drive thin film transistor in the display region on the base substrate, and the drive thin film transistor includes a gate, a source and a drain, and the voltage line is disposed at a same layer as the source and the drain.

DETAILED DESCRIPTION

In order to enable a person skilled in the art to better understand technical solutions of the present disclosure, a transparent display substrate and a driving method thereof, and a transparent display device according to the present disclosure will be described in detail below in conjunction with the accompanying drawings.

In the related art, a transparent region of a conventional transparent display device has a transparency that is not adjustable, which can hardly meet needs under various conditions.

Figure 1:
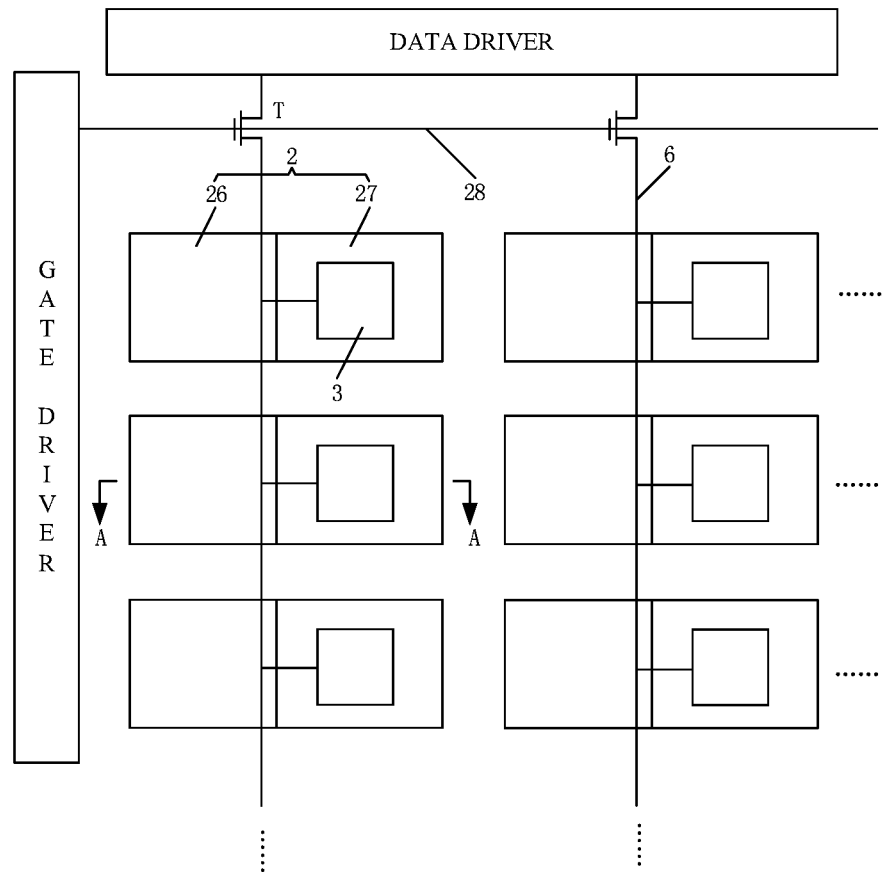
FIG. 1 is a schematic diagram of a structure of a transparent display substrate according to an embodiment of the present disclosure.
Figure 2:
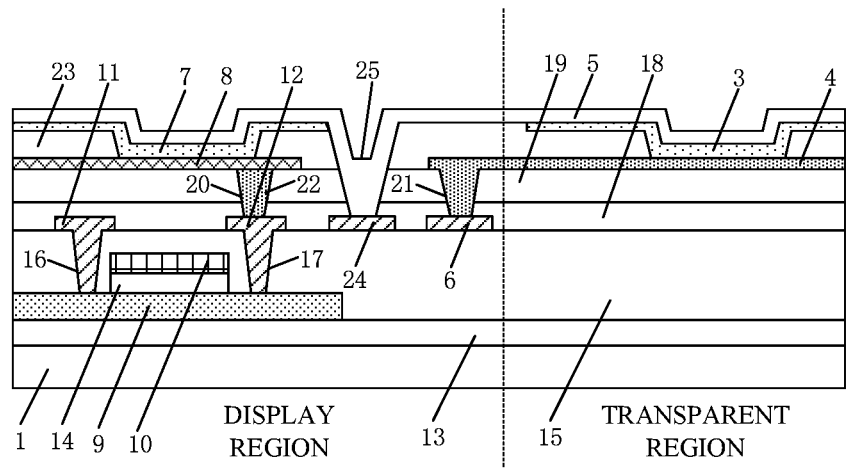
FIG. 2 is a sectional diagram of the transparent display substrate taken along A-A direction shown in FIG. 1.

FIG. 1 is a schematic diagram of a structure of a transparent display substrate according to an embodiment of the present disclosure, and FIG. 2 is a sectional diagram of the transparent display substrate in FIG. 1 taken along A-A direction. As shown in FIGS. 1 and 2, the transparent display substrate may include: a base substrate 1 and pixel units 2 which are located above the base substrate 1 and arranged in an array, each of the pixel units 2 may include a display region 26 and a transparent region 27. The transparent region 27 has a first light emitting layer 3 provided therein, and a first electrode 4 and a second electrode 5 are provided, respectively, at two sides of the first light emitting layer 3 along a direction perpendicular to the base substrate 1. A brightness of light emitted by the first light emitting layer 3 is adjusted according to a voltage difference between the first electrode 4 and the second electrode 5. For example, the first electrode 4 and the second electrode 5 are configured to load a first voltage and a second voltage on the first electrode 4 and the second electrode 5, respectively. The brightness of light emitted by the first light emitting layer 3 is changed when the voltage difference between the first electrode and the second electrode is changed.

The display region 26 is configured to display an image, and the transparent region 27 is configured to allow a user to see an object behind the transparent display device.

For example, if the first electrode 4 is loaded with a first voltage, and the second electrode 5 is loaded with a second voltage, the first light emitting layer 3 emits light under the control of the voltage difference between the first and second voltages. When the voltage difference becomes higher, the brightness of light emitted by the first light emitting layer 3 is increased, and then transparency of the transparent region is lowered; when the voltage difference becomes smaller, the brightness of light emitted by the first light emitting layer 3 is decreased, and then transparency of the transparent region is higher. Thus, by changing the voltage difference, one can change the brightness of light emitted by the first light emitting layer 3, and in turn can change the transparency of the transparent region.

The first light emitting layer 3 is made of an electroluminescent (EL for short) material, and includes an electroluminescent layer. The first electrode 4 may be an anode of the first light emitting layer 3, the second electrode 5 may be a cathode of the first light emitting layer 3, and the first light emitting layer 3 emits light under the control of the first and second voltages applied by the first electrode 4 and the second electrode 5. And the first light emitting layer 3 has a high transparency when it is not emitting light, and may serve as a transparent material.

The transparent display substrate may further include a voltage line 6, the voltage line 6 is coupled to the first electrode 4 and may be located in the display region 26. For example, the first electrode 4 is located at a side of the first light emitting layer 3 proximal to the base substrate 1, and the first electrode 4 extends from the transparent region to the display region, the voltage line 6 is coupled to a part of the first electrode 4 that extends into the display region. The voltage line 6 is configured to output the first voltage to the first electrode 4.

In an embodiment of the present disclosure, one voltage line 6 corresponds to multiple first electrodes 4 and is coupled to each of the corresponding first electrodes 4. For example, one voltage line 6 corresponds to first electrodes 4 of all pixel units 2 in a column of pixel units 2 and is coupled to each corresponding first electrode 4. The voltage line 6 is arranged in the display region 26, which can prevent the voltage line 6 from occupying an area of the transparent region 27, thereby increasing a transparent area of the transparent region 27.

As shown in FIG. 1, an orthographic projection of the first light emitting layer 3 on the base substrate 1 has an area smaller than or equal to that of an orthographic projection of the transparent region 27 on the base substrate 1, that is, the orthographic projection of the first light emitting layer 3 on the base substrate 1 is entirely covered by the orthographic projection of the transparent region 27 on the base substrate 1. Optionally, the area of the orthographic projection of the first light emitting layer 3 on the base substrate 1 is smaller than the area of the orthographic projection of the transparent region 27 on the base substrate 1, which prevents interference with normal display of the display region 26 when the brightness of the first light emitting layer 3 is adjusted, so as to better adjust the transparency of the transparent region 27.

In an embodiment of the present disclosure, both the first electrode 4 and the second electrode 5 are made of a transparent conducive material, such as indium tin oxides (ITO for short), so as to ensure the transparency of the transparent region 27.

As shown in FIGS. 1 and 2, in the display region 26, there are provided a drive thin film transistor and a second light emitting layer 7, and a third electrode 8 and the second electrode 5 are disposed at two sides of the second light emitting layer 7 in a direction perpendicular to the base substrate 1, and the third electrode 8 may be located at a side of the second light emitting layer 7 proximal to the base substrate 1. The third electrode 8 is coupled to the drive thin film transistor. The drive thin film transistor may include an active layer 9, a gate 10, a source 11 and a drain 12. For example, the gate of the drive thin film transistor is coupled to a gate line, the source is coupled to a data line, and the drain is coupled to the third electrode 8. The voltage line 6 is disposed at a same layer as the source and the drain, for example, the voltage line 6 is disposed at a same layer as the source 11 and the drain 12.

It is to be noted that, in the embodiment of the present disclosure, being disposed at a same layer means being manufactured simultaneously by one process using a same material.

As shown in FIG. 2, a buffer layer 13 is provided on the base substrate 1. The active layer 9 is located on the buffer layer 13. A gate insulation layer 14 is provided on the active layer 9. The gate 10 is located on the gate insulation layer 14. In the present embodiment, the gate insulation layer 14 and the gate 10 are formed by one patterning process, for example, the gate insulation layer 14 and the gate 10 may be formed by photolithography process using one mask plate. An inter-layer dielectric layer (ILD) 15 is formed on the gate 10, and this inter-layer dielectric layer 15 covers the entire base substrate 1. The source 11, the drain 12 and the voltage line 6 are located on the inter-layer dielectric layer 15. A first via hole 16 and a second via hole 17 are provided in the inter-layer dielectric layer 15 on the active layer 9, a part of the source 11 is located in the first via hole 16 to realize connection between the source 11 and the active layer 9, a part of the drain 12 is located in the second via hole 17 to realize connection between the drain 12 and the active layer 9.

Further provided on the source 11, the drain 12 and the voltage line 6 is a passivation layer 18, which covers the entire base substrate 1. A resin layer 19 is provided on the passivation layer 18, and covers the entire base substrate 1. The first electrode 4 and the third electrode 8 are located on the resin layer 19. A third via hole 20 and a fourth via hole 21 are provided in the passivation layer 18 and the resin layer 19, the third via hole 20 is located on the drain 12, the fourth via hole 21 is located on the voltage line 6. A connection structure 22 is provided in the third via hole 20, the connection structure 22 is provided at a same layer as the first electrode 4, and the connection structure 22 has an end coupled to the third electrode 8 and another end coupled to the drain 12, to realize connection between the third electrode 8 and the drain 12. Further, a part of the first electrode 4 is located in the fourth via hole 21 to realize connection between the first electrode 4 and the voltage line 6.

A pixel definition layer 23 is formed on the first electrode 4 and the third electrode 8, and the pixel definition layer 23 is provided with multiple first openings and second openings penetrating the pixel definition layer 23 in a direction perpendicular to the base substrate, the first electrode and the third electrode are exposed in the first opening and the second opening, respectively. The first light emitting layer 3 is disposed in the first opening, and is coupled to the first electrode 4 at the bottom of the first opening; the second light emitting layer 7 is disposed in the second opening, and is coupled to the third electrode at the bottom of the second opening. In the embodiment of the present disclosure, the first light emitting layer 3 extends onto an upper surface of the pixel definition layer 23, and the second light emitting layer 7 extends onto an upper surface of the pixel definition layer 23.

The second electrode 5 is located on the first light emitting layer 3 and the second light emitting layer 7, and covers upper surfaces of the first light emitting layer 3 and the second light emitting layer 7. Optionally, the second electrode 5 covers the entire base substrate 1, thus the second electrode 5 covers the display region and the transparent region, and the second electrode 5 is coupled to the first light emitting layer 3 and the second light emitting layer 7. In an embodiment of the present disclosure, optionally, the third electrode 8 may be an anode of the second light emitting layer 7, and the second electrode 5 may be a cathode of the second light emitting layer 7.

In an embodiment of the present disclosure, as for the first light emitting layer 3 and the second light emitting layer 7, the second electrode 5 is used as their common cathode, to simplify the structure of the transparent display substrate and manufacturing process of the transparent display substrate.

Further, as shown in FIG. 2, the transparent display substrate may further include an auxiliary electrode (e.g. an auxiliary cathode 24 in the embodiment), which is coupled to the second electrode 5. For example, the auxiliary cathode 24 is located on an upper surface of the inter-layer dielectric layer 15, and the auxiliary cathode 24 is disposed at the same layer as the voltage line 6, the source 11 and the drain 12. A fifth via hole 25 is provided in the passivation layer 18, the resin layer 19 and the pixel definition layer 23, the fifth via hole 25 is located on the auxiliary cathode 24, and a part of the second electrode 5 is located in the fifth via hole 25 to realize connection between the second electrode 5 and the auxiliary cathode 24. In an embodiment of the present disclosure, the auxiliary cathode 24 may be set at a low electric level of 0V, the connection between the auxiliary cathode 24 and the second electrode 5 can reduce IR drop on the second electrode 5, thereby supplying a constant second voltage to the second electrode 5.

In an embodiment of the present disclosure, the second light emitting layer 7 is made of an electroluminescent material, and thus includes an electroluminescent layer. The second electrode 5 is loaded with the second voltage, the third electrode 8 is loaded with a third voltage, and the second light emitting layer 7 emits white light under the control of a voltage difference between the third voltage and the second voltage. Further, optionally, the transparent display substrate may further include a color filter (not illustrated) located in the display region, the color filter is located above the second electrode 5. For example, the color filter may be a red color filter, a green color filter or a blue color filter.

In an embodiment of the present disclosure, the third electrode 8 is a reflective electrode, and optionally, a material of the third electrode 8 may include any metal or alloy of Al, Mg, W, Cu, Ni, and Ti.

As shown in FIG. 1, the transparent display substrate includes a gate driver and a data driver, the gate driver is coupled to multiple gate lines, and the data driver is coupled to multiple data lines. The transparent display substrate further includes a control line 28, and a switch transistor T provided corresponding to each voltage line 6.

For example, a control pole of the switch transistor T is coupled to the control line 28, the control line 28 is further coupled to the gate driver; a first pole of the switch transistor T is coupled to the data driver; a second pole of the switch transistor T is coupled to the voltage line 6. The gate driver outputs a control signal to the control pole of the switch transistor T to turn on the switch transistor T, the data driver inputs the first voltage to the voltage line 6 through the turned-on switch transistor T, and the voltage line 6 outputs the first voltage to each of the first electrodes 4. In an embodiment of the present disclosure, each voltage line 6 is coupled to each first electrode 4 in a column of pixel units 2, thus when the switch transistor T is turned on, each voltage line 6 may output the first voltage to each first electrode 4 in the column of pixel units 2.

The control line 28 may be coupled to multiple switch transistors T, for example, the control line 28 may be coupled to control poles of a row of switch transistors T. The gate driver may output the control signal to the multiple switch transistors T through the control line 28 to turn on the multiple switch transistors T. It is to be noted that, the first pole of the switch transistor T may be a source of the switch transistor, in which case the second pole is a drain of the switch transistor; or, the first pole is a drain, the second pole is a source, and the embodiment is not limited thereto.

As shown in FIGS. 1 and 2, in the present embodiment, if the second voltage loaded on the second electrode 5 does not change, the first voltage loaded on the first electrode 4 is changed to change brightness of light emitted by the first light emitting layer 3, which in turn changes transparency of the transparent region.

It is to be noted that, FIG. 1 merely illustrates a partial structure of the transparent display substrate, and FIG. 2 may be referred to for the rest of the structure.

It is to be noted that, the part of the second electrode located in the transparent region of the present embodiment may also be formed as a separate electrode which is not coupled to the part of the second electrode located in the display region. For example, a separate transparent electrode may be formed at a side of the first light emitting layer 3 distal to the base substrate 1, and the transparent electrode is coupled to the first light emitting layer 3 and is formed as a cathode of the first light emitting layer 3, which is not limited herein.

In the technical solution of the transparent display substrate according to the present embodiment, the first light emitting layer is disposed in the transparent region, the brightness of light emitted by the first light emitting layer is changed when the voltage difference between the first and second voltages loaded on the first and second electrodes changes. The present embodiment changes transparency of the transparent region by changing the brightness of light emitted by the first light emitting layer in the transparent region, thereby realizing adjustability of transparency of the transparent region.

Figure 3:
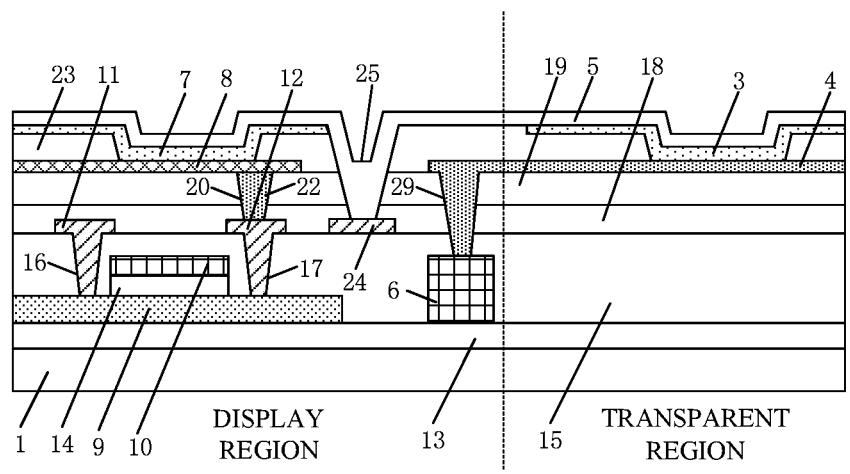
FIG. 3 is a schematic diagram of a structure of another transparent display substrate according to an embodiment of the present disclosure.

FIG. 3 is a schematic diagram of a structure of another transparent display substrate according to an embodiment of the present disclosure. As shown in FIG. 3, the transparent display substrate of the present embodiment is different from that of the embodiment shown in FIG. 2 in that the voltage line 6 is disposed at the same layer as the gate 10 of the drive thin film transistor. For example, the voltage line 6 is formed simultaneously with the gate 10 of the drive thin film transistor by one process using the same material. For example, a sixth via hole 29 is provided in the inter-layer dielectric layer 15, the passivation layer 18 and the resin layer 19, and a part of the first electrode 4 is located in the sixth via hole 29 to realize connection between the first electrode 4 and the voltage line 6.

For description of the rest of the structure of the transparent display substrate, one may refer to the above embodiment show in FIG. 2, which is not repeated herein.

In the technical solution of the transparent display substrate according to the present embodiment, the first light emitting layer is disposed in the transparent region, the first electrode and the second electrode load the first and second voltages to the first light emitting layer, and the brightness of light emitted by the first light emitting layer is changed when the first and second voltages loaded on the first light emitting layer changes. The present embodiment changes transparency of the transparent region by changing the brightness of light emitted by the first light emitting layer in the transparent region, thereby realizing adjustability of transparency of the transparent region.

Figure 4:
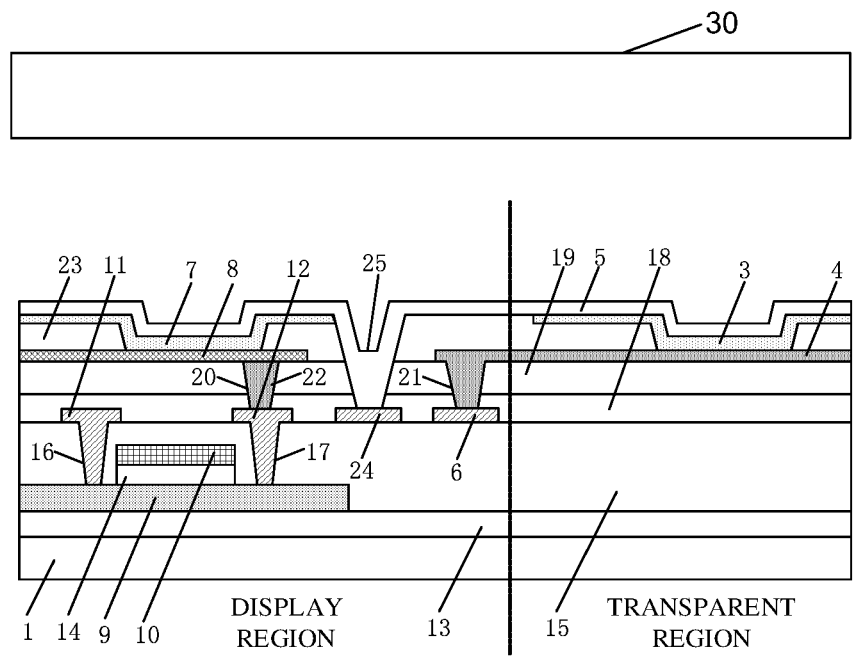
FIG. 4 is a schematic diagram of a structure of a transparent display device according to an embodiment of the present disclosure.

An embodiment of the present disclosure provides a transparent display device. FIG. 4 is a schematic diagram of a structure of the transparent display device according to an embodiment of the present disclosure. The transparent display device may include a transparent display substrate. The transparent display substrate may be the transparent display substrate of the embodiment shown in FIG. 2 or the embodiment shown in FIG. 3, description of which is not repeated herein.

Further, as shown in FIG. 4, the transparent display device may also further include an encapsulation structure 30 provided opposite to the transparent display substrate. Optionally, the encapsulation structure 30 may include a glass cover plate or a multilayer film.

In the present embodiment, the transparent display device is an OLED transparent display device.

In the technical solution of the transparent display device according to the present embodiment, the first light emitting layer is disposed in the transparent region, the first electrode and the second electrode load the first and second voltages to the first light emitting layer, and the brightness of light emitted by the first light emitting layer is changed when the first and second voltages loaded on the first light emitting layer changes. The present embodiment changes transparency of the transparent region by changing the brightness of light emitted by the first light emitting layer in the transparent region, thereby realizing adjustability of transparency of the transparent region.

Figure 5:
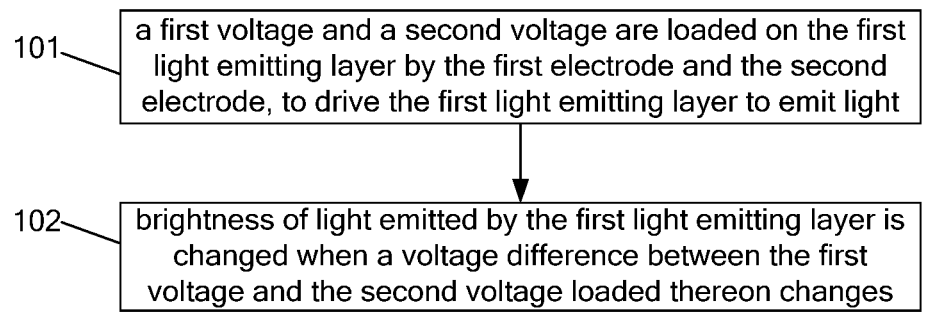
FIG. 5 is a flow chart of a driving method of a transparent display substrate according to an embodiment of the present disclosure.

FIG. 5 is a flow chart of a driving method of a transparent display substrate according to an embodiment of the present disclosure. The transparent display substrate may include a base substrate and pixel units which are located above the base substrate and arranged in an array, and each of the pixel units may include a display region and a transparent region. A first light emitting layer is provided in the transparent region, and a first electrode and a second electrode are provided, respectively, at two sides of the first light emitting layer along a direction perpendicular to the base substrate.

As shown in FIG. 5, the method may include steps 101 and 103.

At step 101, a first voltage and a second voltage are loaded on the first light emitting layer by the first electrode and the second electrode, to drive the first light emitting layer to emit light.

This step specifically includes: outputting, by the first electrode, a first voltage to the first light emitting layer; outputting, by the second electrode, a second voltage to the first light emitting layer.

In the present embodiment, the transparent display substrate corresponds to a gate driver and a data driver. The transparent display substrate may further include a control line and a switch transistor provided corresponding to each voltage line. A control pole of the switch transistor is coupled to the control line, the control line is further coupled to the gate driver; a first pole of the switch transistor is coupled to the data driver; and a second pole of the switch transistor is coupled to the corresponding voltage line.

Before the step 101, the method may also include: outputting, by the gate driver, a control signal to the control pole of the switch transistor, to turn on the switch transistor; outputting, by the data driver, the first voltage to the first electrode through the turned-on switch transistor and the voltage line.

Optionally, each voltage line is coupled to each first electrode in a column of pixel units. Thus when the switch transistor is turned on, each voltage line may output the first voltage to each first electrode in the column of pixel units. The control line may be coupled to multiple switch transistors, and the gate driver may output the control signal to the multiple switch transistors through the control line to turn on the multiple switch transistors.

At step 102, brightness of light emitted by the first light emitting layer is changed when a voltage difference between the first voltage and the second voltage loaded thereon changes.

The driving method of the transparent display substrate according to the present embodiment is used for driving the transparent display substrate according to the embodiment shown in FIG. 2 or the embodiment shown in FIG. 3.

In the technical solution of the driving method of the transparent display substrate according to the present embodiment, the first light emitting layer is disposed in the transparent region, the first electrode and the second electrode load the first voltage and the second voltage to the first light emitting layer, and the brightness of light emitted by the first light emitting layer is changed when the voltage difference loaded on the first light emitting layer changes. The present embodiment changes transparency of the transparent region by changing the brightness of light emitted by the first light emitting layer in the transparent region, thereby realizing adjustability of transparency of the transparent region.

Figure 6:
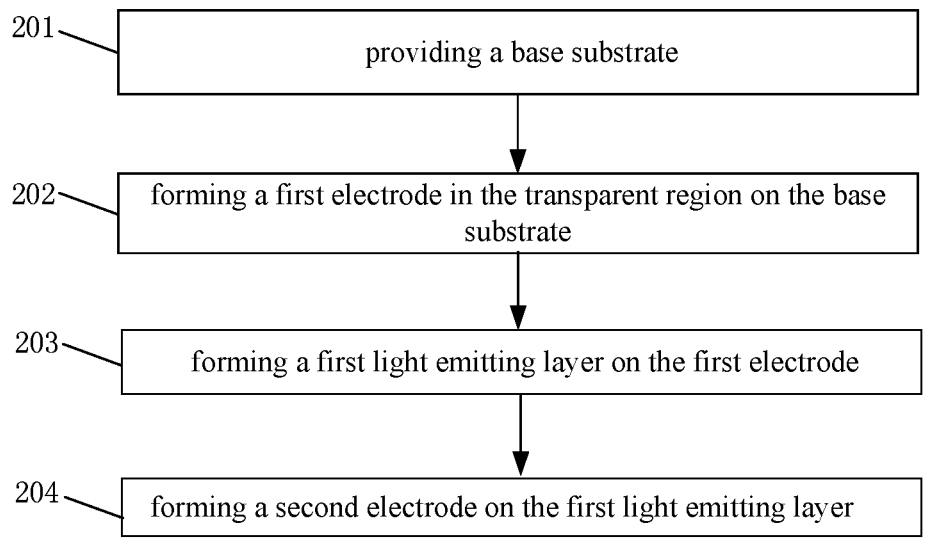
FIG. 6 is a flow chart of a manufacturing method of a transparent display substrate according to an embodiment of the present disclosure.

FIG. 6 is a flow chart of a manufacturing method of a transparent display substrate according to an embodiment of the present disclosure. The transparent display substrate may include a base substrate and pixel units which are located above the base substrate and arranged in an array, wherein each of the pixel units may include a display region and a transparent region. As shown in FIG. 6, the manufacturing method of the transparent display substrate may include steps 201 to 204.

At step 201, a base substrate is provided.

At step 202, a first electrode is formed in the transparent region on the base substrate.

At step 203, a first light emitting layer is formed on the first electrode.

At step 204, a second electrode is formed on the first light emitting layer.

For example, brightness of light emitted by the first light emitting layer is adjusted according to change in the voltage difference between the first voltage and the second voltage loaded on the first electrode and the second electrode, respectively.

In the technical solution of the manufacturing method of the transparent display substrate according to the present embodiment, the first light emitting layer is disposed in the transparent region, the first electrode and the second electrode load the first voltage and the second voltage to the first light emitting layer, and the brightness of light emitted by the first light emitting layer is changed when the voltage difference loaded on the first light emitting layer changes. The present embodiment changes transparency of the transparent region by changing the brightness of light emitted by the first light emitting layer in the transparent region, thereby realizing adjustability of transparency of the transparent region.

Figure 7:
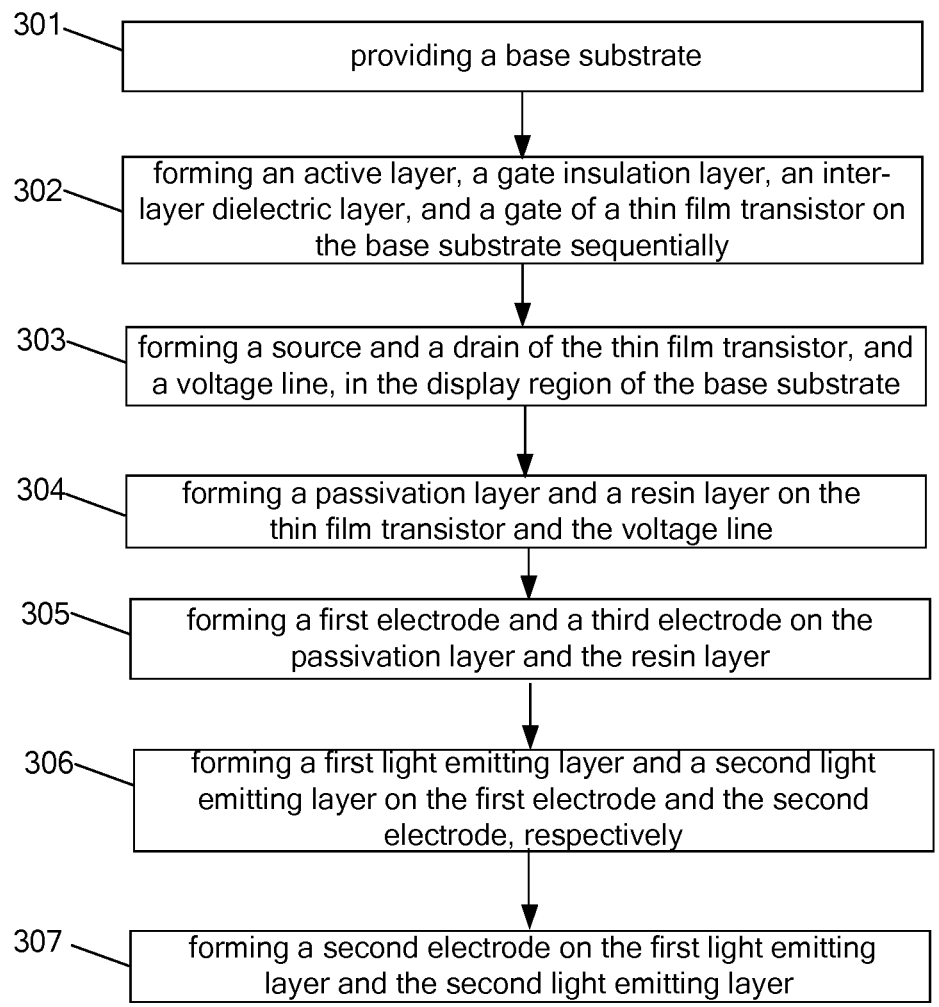
FIG. 7 is a flow chart of a manufacturing method of a transparent display substrate according to another embodiment of the present disclosure.

FIG. 7 is a flow chart of a manufacturing method of a transparent display substrate according to another embodiment of the present disclosure. The transparent display substrate may include a base substrate and pixel units which are located above the base substrate and arranged in an array, and each of the pixel units may include a display region and a transparent region. As shown in FIG. 7, the manufacturing method of the transparent display substrate may include steps 301 to 307.

At step 301, a base substrate is provided.

At step 302, an active layer, a gate insulation layer, an inter-layer dielectric layer, and a gate of a drive thin film transistor are sequentially formed on the base substrate. The gate is disposed on the gate insulation layer, the inter-layer dielectric is disposed on the gate, and the drive thin film transistor is disposed in the display region and is configured to drive a light emitting device in the display region to emit light.

For example, the gate insulation layer and the gate are formed by one patterning process. For example, the gate insulation layer and the gate are formed by a photolithography process with a same mask plate.

At step 303, a source and a drain of the drive thin film transistor, and a voltage line are formed in the display region of the base substrate, and the voltage line is disposed at the same layer as the source and the drain of the drive thin film transistor.

For example, the gate is disposed above the active layer, the source and the drain of the drive thin film transistor and the voltage line are disposed on the inter-layer dielectric, a first via hole and a second via hole are provided in the inter-layer dielectric, and the source and the drain are coupled to the active layer, respectively, through the first via hole and the second via hole.

For example, the voltage line, and the source and the drain of the drive thin film transistor are formed simultaneously with a same material by the same process. In other embodiments of the present disclosure, the voltage line and the gate of the drive thin film transistor may also be formed simultaneously with a same material by the same process.

At step 304, a passivation layer and a resin layer are formed on the drive thin film transistor and the voltage line.

At step 305, a first electrode and a third electrode are formed on the passivation layer and the resin layer, the first electrode is disposed in the transparent region, and the third electrode is disposed in the display region.

For example, a third via hole and a fourth via hole are provided in the passivation layer and the resin layer located in the display region, the drain of the drive thin film transistor is coupled to the third electrode through the third via hole, and the voltage line is coupled to a part of the first electrode extending into the display region through the fourth via hole.

At step 306, a first light emitting layer and a second light emitting layer are formed on the first electrode and the second electrode, respectively.

For example, the first light emitting layer is disposed in the transparent region, an orthographic projection of the first light emitting layer on the base substrate is covered completely by an orthographic projection of the transparent region on the base substrate. The second light emitting layer is disposed in the display region.

At step 307, a second electrode is formed on the first light emitting layer and the second light emitting layer.

For example, the second electrode covers an upper surface of the first light emitting layer and the second light emitting layer. Optionally, the second electrode covers an entire upper surface of the base substrate.

In the technical solution of the manufacturing method of the transparent display substrate according to the present embodiment, the first light emitting layer is disposed in the transparent region, the first electrode and the second electrode load the first voltage and the second voltage to the first light emitting layer, and the brightness of light emitted by the first light emitting layer is changed when the voltage difference loaded on the first light emitting layer changes. At the same time, the voltage line is disposed in the display region, for example, the voltage line may be disposed at a same layer as the gate of the drive thin film transistor, or may be disposed at a same layer as the source and the drain of the drive thin film transistor. The present embodiment changes transparency of the transparent region by changing the brightness of light emitted by the first light emitting layer in the transparent region, thereby realizing adjustability of transparency of the transparent region.

The manufacturing method of the transparent display substrate of the embodiment of the present disclosure may be a method for manufacturing one of the transparent display substrates of above embodiments shown in FIGS. 1 to 3. In other embodiments of the present disclosure, a manufacturing method of transparent display substrate of the above embodiments shown in FIGS. 1 to 3 may be formed by other processes. Above description may be referred to for specific features and technical effects of each structure, which is not repeated herein.

It should be understood that, the above embodiments are only exemplary embodiments for the purpose of explaining the principle of the present disclosure, and the present disclosure is not limited thereto. For one of ordinary skill in the art, various improvements and modifications may be made without departing from the spirit and essence of the present disclosure. These improvements and modifications also fall within the protection scope of the present disclosure.

What is claimed is:

1. A transparent display substrate, comprising: a base substrate and pixel units which are located above the base substrate and arranged in an array, wherein each of the pixel units comprises a display region and a transparent region;
   a first light emitting layer is provided in the transparent region, and a first electrode is provided at a side of the first light emitting layer proximal to the base substrate and a second electrode is provided at a side of the first light emitting layer distal to the base substrate;
   a brightness of light emitted by the first light emitting layer is adjusted according to change in a difference between a first voltage and a second voltage loaded on the first electrode and the second electrode, respectively,
   wherein the transparent display substrate further comprises a voltage line coupled to the first electrode, and an auxiliary electrode, wherein
   the voltage line and the auxiliary electrode are both located in the display region;
   the voltage line is configured to output the first voltage to the first electrode, and the auxiliary electrode is configured to output the second voltage to the second electrode;
   the first electrode extends from the transparent region to the display region, and is electrically coupled to the voltage line in the display region through a fourth via hole in a first insulation layer arranged between the voltage line and the first electrode; and
   the second electrode extends from the transparent region to the display region, and is electrically coupled to the auxiliary electrode in the display region through a third via hole in a second insulation layer arranged between the voltage line and the first electrode.

2. The transparent display substrate according to claim 1, wherein the first light emitting layer comprises an electroluminescent layer.

3. The transparent display substrate according to claim 1, wherein an orthographic projection of the first light emitting layer on the base substrate is entirely covered by an orthographic projection of the transparent region on the base substrate.

4. The transparent display substrate according to claim 1, wherein the first electrode and the second electrode are both made of a transparent conducive material.

5. The transparent display substrate according to claim 1, wherein a second light emitting layer is provided in the display region, and a third electrode is provided at a side of the second light emitting layer proximal to the base substrate, and the second electrode is provided at a side of the second light emitting layer distal to the base substrate.

6. The transparent display substrate according to claim 5, wherein the third electrode is a reflective electrode.

7. The transparent display substrate according to claim 5, wherein a drive thin film transistor is provided in the display region, and the drive thin film transistor comprises a gate, a source, and a drain,
   the gate of the drive thin film transistor is coupled to a gate line, the source of the drive thin film transistor is coupled to a data line, and the drain of the drive thin film transistor is coupled to the third electrode.

8. The transparent display substrate according to claim 7, wherein the third electrode is electrically coupled to the drain of the drive thin film transistor by a connection structure formed in a third via hole in a third insulation layer arranged between the third electrode and the drain in the display region.

9. The transparent display substrate according to claim 8, wherein the voltage line is disposed at a same layer as the source and the drain.

10. The transparent display substrate according to claim 8, wherein the voltage line is disposed at a same layer as the gate.

11. The transparent display substrate according to claim 8, wherein
the third insulation layer is a part of the first insulation layer extending into the display region; and
the transparent display substrate further comprises a pixel definition layer provided on the first and third electrodes, which are provided on the first insulation layer, the pixel definition layer is provided with a first opening in the transparent region and a second opening in the display region, and the first light emitting layer and the second light emitting layer are provided in the first opening and the second opening respectively.

12. The transparent display substrate according to claim 1, wherein the transparent display substrate further comprises a gate driver and a data driver, and the transparent display substrate further comprises a control line and a switch transistor provided corresponding to a column of pixel units,
a control pole of the switch transistor is coupled to the control line, and the control line is further coupled to the gate driver; and
a first pole of the switch transistor is coupled to the data driver; and a second pole of the switch transistor extends through the display region of each pixel unit of the column of pixel units to be coupled to the voltage line in the pixel unit.

13. A transparent display device, comprising: the transparent display substrate according to claim 1 and an encapsulation structure provided opposite to the transparent display substrate.

14. A driving method of a transparent display substrate, wherein the transparent display substrate comprises a base substrate and pixel units which are located above the base substrate and arranged in an array, wherein each of the pixel units comprises a display region and a transparent region, a first light emitting layer is provided in the transparent region, and a first electrode is provided at a side of the first light emitting layer proximal to the base substrate and a second electrode is provided at a side of the first light emitting layer distal to the base substrate, wherein the transparent display substrate further comprises a voltage line coupled to the first electrode, and an auxiliary electrode, wherein
the voltage line and the auxiliary electrode are both located in the display region;
the voltage line is configured to output the first voltage to the first electrode, and the auxiliary electrode is configured to output the second voltage to the second electrode;
the first electrode extends from the transparent region to the display region, and is electrically coupled to the voltage line in the display region through a fourth via hole in a first insulation layer arranged between the voltage line and the first electrode; and
the second electrode extends from the transparent region to the display region, and is electrically coupled to the auxiliary electrode in the display region through a third via hole in a second insulation layer arranged between the voltage line and the first electrode;
the method comprises:
loading a first voltage and a second voltage on the first electrode and the second electrode, respectively, to drive the first light emitting layer to emit light; and
adjusting a brightness of light emitted by the first light emitting layer, by changing a difference between a first voltage and a second voltage loaded on the first electrode and the second electrode, respectively.

15. The driving method of a transparent display substrate according to claim 14, wherein the transparent display substrate further comprises a gate driver and a data driver, and the transparent display substrate further comprises a control line and a switch transistor provided corresponding to a column of pixel units,
a control pole of the switch transistor is coupled to the control line, and the control line is further coupled to the gate driver; and
a first pole of the switch transistor is coupled to the data driver; and a second pole of the switch transistor extends through the display region of each pixel unit of the column of pixel units to be coupled to the voltage line in the pixel unit;
before the loading a first voltage and a second voltage on the first electrode and the second electrode, respectively, to drive the first light emitting layer to emit light, the method comprises:
outputting, by the gate driver, a control signal to the control pole of the switch transistor, to turn on the switch transistor; and
outputting, by the data driver, the first voltage to the first electrode through the turned-on switch transistor and the voltage line.

16. A manufacturing method of a transparent display substrate, wherein the transparent display device comprises a base substrate and pixel units which are located above the base substrate and arranged in an array, wherein each of the pixel units comprises a display region and a transparent region,
the manufacturing method comprises:
providing a base substrate;
forming a first electrode on the base substrate in the transparent region;
forming a first light emitting layer on the first electrode; and
forming a second electrode on the first light emitting layer;
wherein a brightness of light emitted by the first light emitting layer is adjusted according to change in a difference between a first voltage and a second voltage loaded on the first electrode and the second electrode, respectively,
the manufacturing method further comprises forming a voltage line and an auxiliary electrode on the base substrate in the display region, wherein the voltage line is configured to output the first voltage to the first electrode, and the auxiliary electrode is configured to output the second voltage to the second electrode;
the first electrode extends from the transparent region to the display region, and is electrically coupled to the voltage line in the display region through a fourth via hole in a first insulation layer arranged between the voltage line and the first electrode; and the second electrode extends from the transparent region to the display region, and is electrically coupled to the auxiliary electrode in the display region through a third via hole in a second insulation layer arranged between the voltage line and the first electrode.

17. The manufacturing method according to claim 16, further comprising:

forming a drive thin film transistor in the display region on the base substrate, wherein the drive thin film transistor comprises a gate, a source and a drain, and the voltage line is disposed at a same layer as the source and the drain.

\* \* \* \* \*